Figure 1:
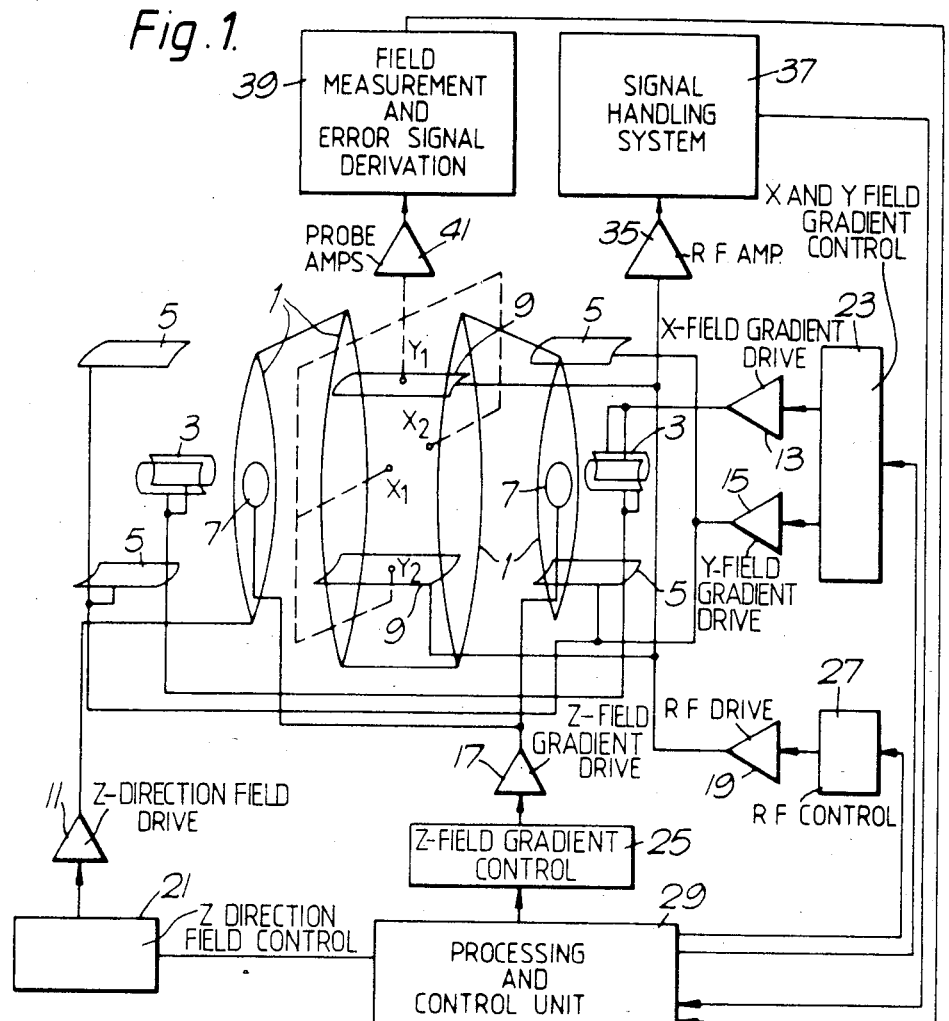

United States Patent [19]

Young et al.

[11] Patent Number: 4,564,813
[45] Date of Patent: Jan. 14, 1986

[54] NUCLEAR MAGNETIC RESONANCE METHOD AND APPARATUS

[75] Inventors: Ian R. Young, Sunbury-on-Thames; David R. Bailes, London, both of England

[73] Assignee: Picker International, Ltd., Wembley, England

[21] Appl. No.: 545,964

[22] Filed: Oct. 27, 1983

[30] Foreign Application Priority Data

Nov. 10, 1982 [GB] United Kingdom ............... 8232144

[51] Int. Cl.$^4$ .......................................... G01R 33/22
[52] U.S. Cl. .................................... 324/311; 324/309
[58] Field of Search ....................... 324/307, 309, 311

[56] References Cited

U.S. PATENT DOCUMENTS

| | | | |
|---|---|---|---|
| 3,530,374 | 9/1970 | Haeberlen | 324/311 |
| 4,290,019 | 9/1981 | Hutchinson | 324/311 |
| 4,352,066 | 9/1982 | Kendrick | 324/311 |
| 4,383,219 | 5/1983 | Kaplan | 324/309 |

FOREIGN PATENT DOCUMENTS

| | | | |
|---|---|---|---|
| 2056078 | 8/1979 | United Kingdom | 324/311 |
| 1578910 | 11/1980 | United Kingdom | 324/311 |

Primary Examiner—Reinhard J. Eisenzopf
Assistant Examiner—G. Peterkin
Attorney, Agent, or Firm—Watts, Hoffmann, Fisher & Heinke Co.

[57] ABSTRACT

A method of nuclear magnetic resonance imaging of a body in which the spins of a chosen nucleus in a selected slice of the body are rotated through an angle appreciably greater than 90°. Two r.f. pulses, each accompanied by a magnetic field having a gradient in a direction parallel to the equilibrium axis of magnetic alignment of the spins are applied in sequence. Each e.f. pulse is at the Larmor frequency for the nuclei in the slice in the presence of the associated field gradient and each r.f. pulse is effective to rotate the spins by not greater than 90°. The r.f. pulses together are sufficient to rotate the spins through the desired angle, the gradients of the magnetic fields being in opposite directions.

9 Claims, 7 Drawing Figures

NUCLEAR MAGNETIC RESONANCE METHOD AND APPARATUS

This invention relates to methods of and apparatus for obtaining a representation of the spatial distribution in a body of a quantity relating to nuclear magnetic resonance (NMR), and apparatus for use therein.

NMR methods and apparatus have been used for the chemical analysis of material for many years. More recently NMR methods and apparatus have been used to obtain images representing the distribution over a selected cross-sectional slice or volume of a body of a chosen quantity, e.g. the density of a chosen nucleus, for example hydrogen, or of NMR spin relaxation time constants $T_1$ and $T_2$. Such distributions are similar to, although of different significance from, the distributions of X-ray attenuation provided by computerised tomography sytems. In such methods and apparatus, it is frequently necessary to rotate the magnetic vectors i.e. spins, of chosen nuclei within a selected slice of the body through angles appreciably greater than 90°, for example 180° in methods of determining the distribution of the spin-lattice relaxation time constant $T_1$. The simplest approach to this is to apply an r.f. pulse which is sufficient to rotate the spins through 180° together with a magnetic gradient field, having a gradient which serves to define the selected slice.

It is found however that this approach is not totally satisfactory because the spins are not rotated through 180° at all points in the slice.

It is thus an object of the invention to provide an improved method and apparatus of rotating spins of a chosen nuclei within a selected slice of a body through angles appreciably greater than 90°.

According to the present invention there is provided a method and apparatus of obtaining a representation of the spatial distribution of a quantity relating to nuclear magnetic resonance in a selected slice of a body wherein rotation of the spins of a chosen nucleus within the selected slice about an axis perpendicular to the equilibrium axis of magnetic alignment of the spins through an angle appreciably greater than 90°. The rotation is effected by applying in sequence two r.f. pulses each accompanied by a magnetic field oriented in a direction parallel to the equilibrium axis and having a gradient in a direction orthogonal to the plane of the slice. Each r.f. pulse is at the Larmor frequency for the nuclei in the slice in the presence of the associated field gradient. Each r.f. pulse is effective to rotate the spins by not greater than 90°. The r.f. pulses together are sufficient to rotate the spins through the angle which, as referred to above, is appreciably greater than 90°. The gradients of the magnetic fields are in opposite directions.

In one particular method and apparatus said angle is 180°.

A method and apparatus according to the invention enables the problem mentioned above to be overcome because this problem only arises when it is attempted to rotate the spins through angles appreciably greater than 90°, the problem being particularly bad for angles of 120° or more, in the presence of a gradient field and the method according to the invention enables such large spin rotations to be avoided.

The invention also provides an apparatus arranged to obtain a representation of the spatial distribution of a quantity relating to nuclear magnetic resonance in a selected slice of a body wherein rotation of the spins of a chosen nucleus within the selected slice about an axis perpendicular to the equilibrium axis of magnetic alignment of the spins through an angle appreciably greater than 90° is effected, the apparatus including: means arranged to apply in sequence two r.f. pulses each accompanied by a magnetic field having a gradient in a direction parallel to said equilibrium axis having a gradient in a direction orthogonal to the plane of the slice, each r.f. pulse being at the Larmor frequency for said nuclei in said slice in the presence of the associated field gradient, and each r.f. pulse being effective to rotate said spins by not greater than 90°, the r.f. pulses together being sufficient to rotate said spins through said angle, and the gradients of said magnetic fields being in opposite directions.

Figure 2:
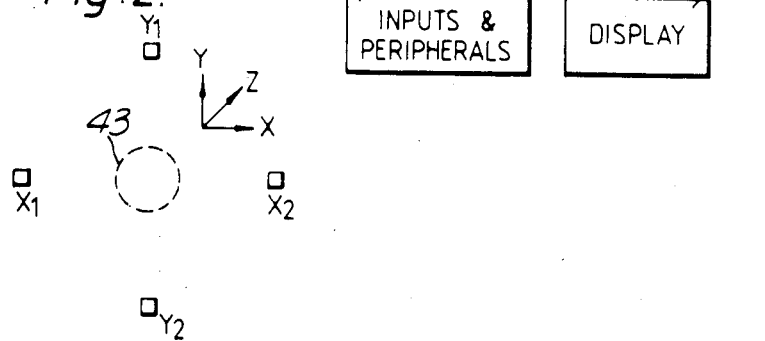
Figure 3A:
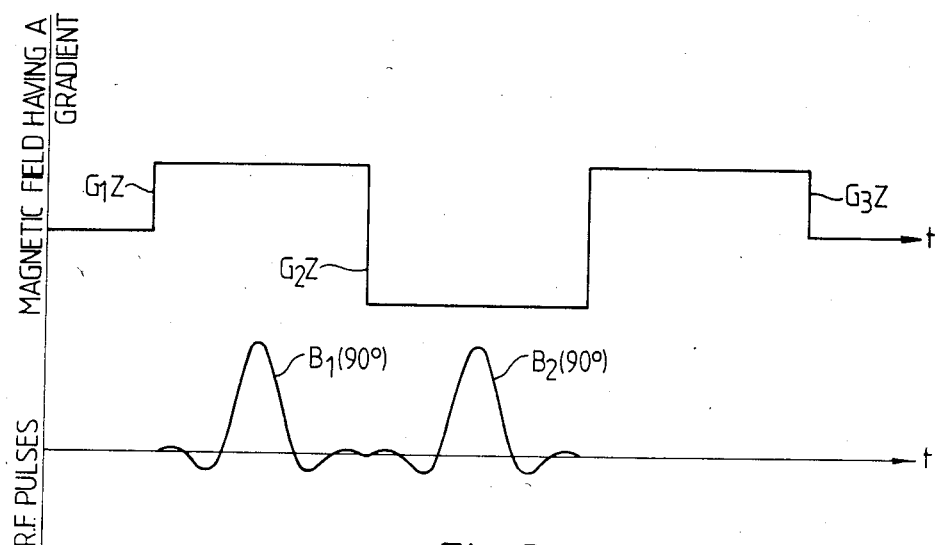
Figure 3B:
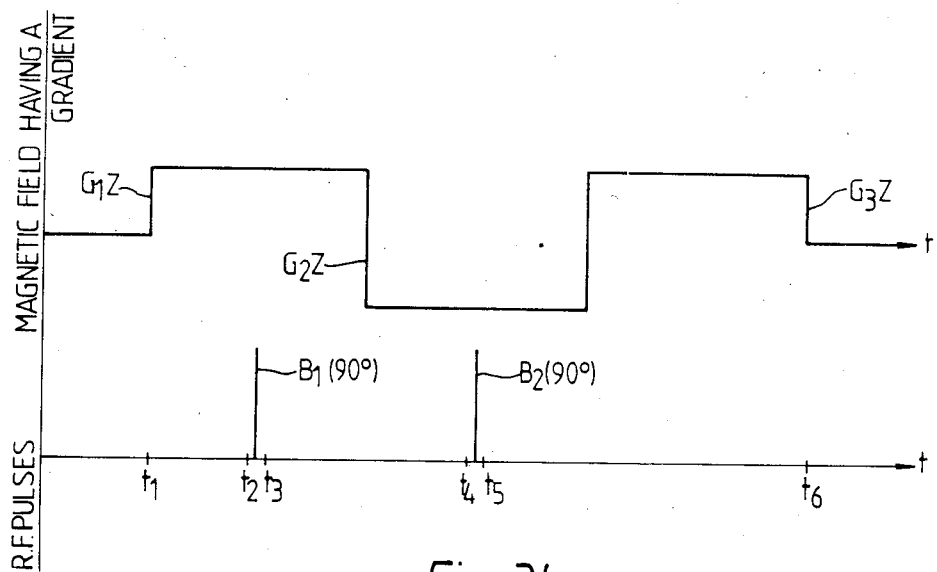
Figure 4A:
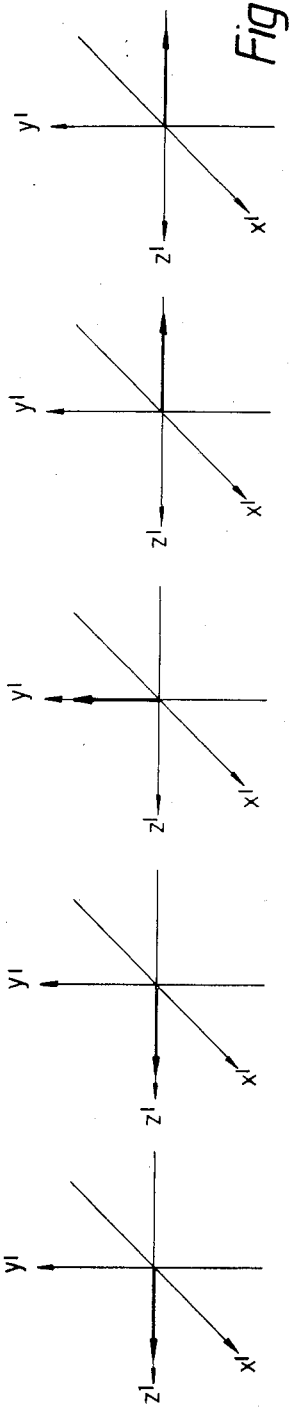
Figure 4B:
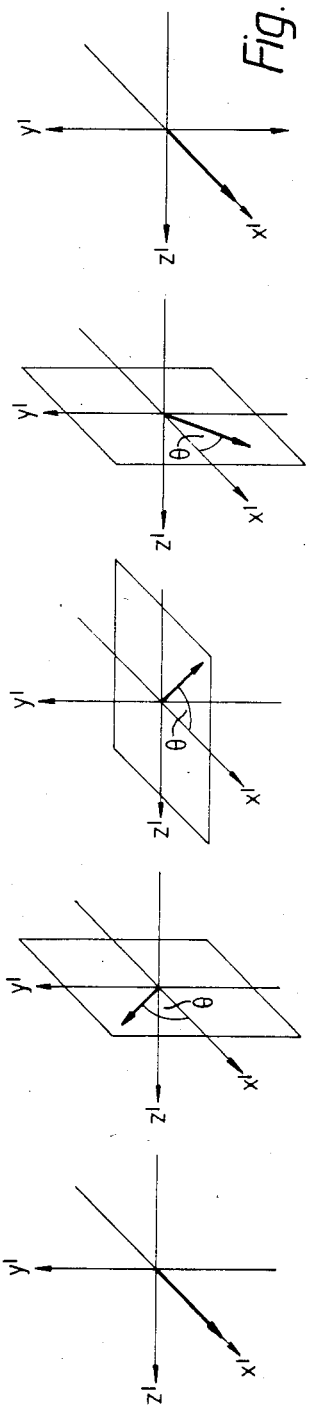
Figure 4C:
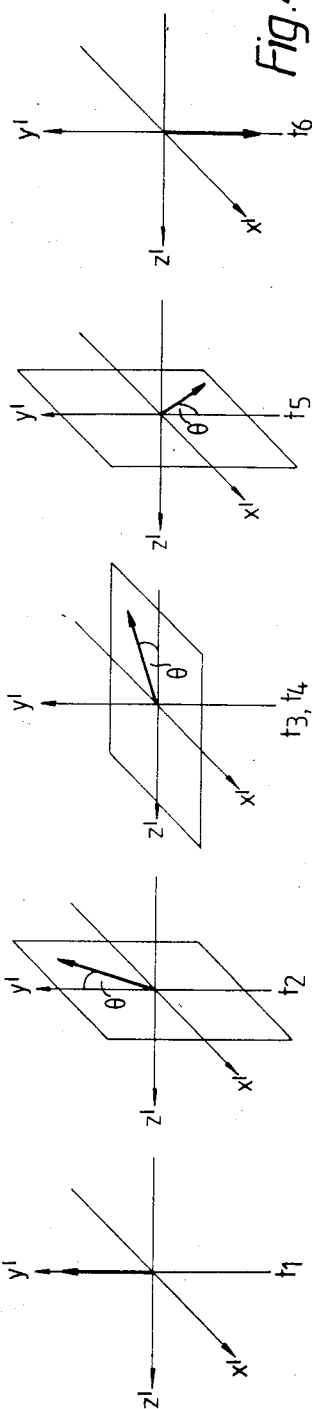

One method of obtaining a representation of the spatial distribution of a quantity relating to nuclear magnetic resonance in a body in which spins of a chosen nucleus within a selected slice of a body are rotated through 180° and apparatus arranged to carry out this method, will now be described, by way of example only, with reference to the accompanying drawings in which:

FIGS. 1 and 2 illustrate the apparatus diagrammatically;

FIGS. 3(a) and 3(b) illustrate the magnetic field sequence employed in the method; and FIGS. 4(a), 4(b) and 4(c) illustrate the directions of the spins during the method for spins starting in the Z' direction, the X' direction and the Y' direction respectively, the X', Y', Z' reference frame shown being a rotating reference frame, rotating at the Larmor frequency for the selected spins within the slice about the Z axis.

The method is performed using an apparatus essentially identical to that described in U.S. Pat. Nos. 4,284,948 or 4,355,282, to which reference should be made for a fuller description, appropriately programmed to apply a sequence of magnetic field gradient and r.f. pulses and analyse the resulting signals as hereafter described.

The essential features of such an apparatus in so far as is required for an understanding of the present invention are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Referring to FIG. 1, the first coil system comprises coils 1 capable of providing a steady uniform magnetic field in the Z direction; coils 3 capable of providing a magnetic field gradient in the X direction, coils 5 capable of providing a magnetic field gradient in the Y direction; and coils 7 capable of providing a magnetic field gradient in the Z direction.

In addition, the apparatus includes a second coil system 9 whereby r.f. magnetic fields can be applied to the body under examination in a plane normal to the direction of the steady uniform magnetic field produced by the first coil system, and whereby r.f. magnetic fields resulting from nuclei in the body under examination which have been excited to nuclear magnetic resonance with a spin vector component other than in the Z direction can be detected.

In the drawing a single pair of coils 9 is shown for both applying and detecting r.f. fields, but in certain circumstances it may be preferable to provide separate coils for detecting the r.f. fields.

The various coils 1, 3, 5, 7 and 9 are driven by drive amplifiers 11, 12, 13, 15, 17 and 19 respectively, controlled by control circuits 21, 23 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits 39 which receive signals via amplifiers 41 from field probes $X_1$, $X_2$, $Y_1$ and $Y_2$ which are disposed at suitable positions in relation to the slice 43 of the body being examined, as illustrated in FIG. 2, to monitor the applied magnetic fields.

In operation of the apparatus a steady uniform magnetic field Bo is applied to the body under examination in the Z direction. This field serves to define the equilibrium axis of magnetic alignment of the nuclei in the body i.e. along the Z direction, and remains constant throughout the examination procedure.

Referring now also to FIGS. 3(a), 3(b) and 4(a) the rotation of spins which initially lie along the equilibrium axis of magnetic alignment i.e. the Z' direction as indicated in the left hand part of FIG. 4(a) which shows the direction of the spins at $t_1$ the beginning of the sequence, will be described first, this situation being applicable, for example, in a $T_1$ imaging sequence. A magnetic field having a gradient $G_1z$ along the Z direction is first applied to the body the gradient being centered about the position along the Z direction of a slice 43 of the body normal to the Z direction, together with an r.f. magnetic field pulse denoted $B_1(90°)$, for reasons explained hereafter. The frequency of the r.f. field is chosen to be the Larmor frequency for hydrogen protons in the slice 43 of the body, the slice being thus defined by a particular magnetic field along the Z direction, such that hydrogen protons within the slice are preferentially excited. The integral of the r.f. pulse is such that the pulse is just sufficient to tip the spins of the excited protons into the X-Y plane, and is thus referred to as a 90° pulse, the spins then precessing in the X-Y plane round the Z axis.

Although the pulse envelopes of the applied r.f. magnetic field pulses are generally chosen to be sinc functions as indicated in FIG. 3(a), to aid the explanation of the method, the pulse envelope shape can be approximated to a $\delta$ function centered at a time between $t_2$ and $t_3$ as shown in FIG. 3(b). This approximation can be shown to be valid within the central region of the slice 43. The spins then lie along the Z' axis in FIG. 4(a) at time $t_2$, but along the Y' axis at time $t_3$.

The field gradient $G_1z$ is then removed, and replaced by a magnetic field having a gradient $-G_2z$ which is again centred about the position along the Z direction of the selected slice 43, but is in the opposite sense, and a second r.f. magnetic field pulse $B_2(90°)$ having the same characteristics as the $B_1(90°)$ pulse is applied, the pulse $B_2(90°)$ being shown as a $\delta$ function in FIG. 3(b) centered at a time between $t_4$ and $t_5$. The effect of this pulse sequence is then to rotate the spins of the excited hydrogen protons within the slice through 180° from their equilibrium axis of magnetic alignment along the +Z direction to the −Z direction. The reversed gradient $-G_2z$ causes rephasing of the spins within the slice which have been dephased by the gradient $G_1z$ through the slice during the initial selective excitation of the spins by the $G_1z$ and $B_1(90°)$ combination, whilst still effecting selective excitation of spins within the slice.

Thus, as shown in FIG. 4(a) the spins will lie along the −Z' axis as required from time $t_5$ onwards. A third magnetic gradient field, having a gradient $G_3z$ may then be applied, this gradient causing dephasing of any spins outside the selected slice 43 which have been rotated by the pulses $B_1(90°)$, $B_2(90°)$ such that they have components of magnetisation in the X-Y plane.

Referring now to FIGS. 4(b) and 4(c), if it is required, to rotate spins which already lie in the X-Y plane through 180° at the start of the sequence, due to some previous magnetic pulse sequence, this being the case, for example, when it is required to form spin echoes the same pulse sequence i.e. $B_1(90°)$ together with $G_1z$, $G_2(90°)$ together with $G_2z$, $G_3z$ is used, although the various gradients have slightly different functions. As shown in FIGS. 4(b) and 4(c) at time $t_1$ the spins lie along X' or Y' in the rotating reference frames. During the period which elapses between $t_1$, and $t_2$, the application of the field gradient $G_1z$ causes a frequency dispersion of the spins in the X-Y plane, such that the spins from a point within the slice 43 are rotated in the X'-Y' plane by an angle as shown. The application between $t_2$ and $t_3$ of the pulse $B_1(90°)$ causes the spins, within the slice, to be rotated by 90° about the X' axis into the Z'-X' plane, the spins still being rotated by $\theta$. The further application between $t_4$ and $t_5$ of $B_2(90°)$ together with the gradient $G_2z$ causes the spins within the slice 43 to be rotated about the X' axis by 90° back into the X-Y plane, the gradient $G_2z$ causing a rotation of the spins in the X'-Y' plane in the opposite sense to the gradient $G_1z$ as indicated. Finally the application of the gradient $G_3z$ causes the rephasing of the spins at time $t_6$ such that spins which originally were lying along the X' direction again lie along the X' direction whilst spins which originally lay along the Y' direction lie along the −Y' direction. It will be appreciated that the gradient $G_3z$ will also, as in the case of the rotation by 180° from the Z direction, dephase any spins outside the selected slice 43 which have components of magnetisation in the X-Y plane.

It will be appreciated that whilst the method described herebefore relates to spin rotations of 180°, the method is equally applicable to other angles appreciably greater than 90°, the angle through which each r.f. pulse rotates the spins being chosen accordingly.

For such angles, however, it is necessary to apply a further gradient field having a gradient in the same sense as the $G_2z$ gradient before the application of the $G_1z$ gradient and the $B_1(90°)$ magnetic field pulse. The particular symmetry of the system for a 180° rotation allows this application of this further gradient to be omitted.

It will also be appreciated that whilst the methods described herebefore relate to rotating the spins of hydrogen protons within a selected slice, the methods are equally applicable to rotating the spins of other nuclei having a magnetic spin, e.g. $^{31}P$, by appropriate choice of the r.f. pulse frequency and amplitude.

We claim:

1. A method of obtaining a representation of the spatial distribution of a quantity relating to nuclear magnetic resonance in a selected slice of a larger body, wherein rotation of the spins of a chosen nucleus within the selected slice, about an axis perpendicular to the equilibrium axis of magnetic alignment of the spins, is effected through an angle appreciably greater than 90° by applying in sequence two r.f. pulses, each accompanied by a magnetic field oriented in a direction parallel to said equilibrium axis and having a gradient in a direction orthogonal to the plane of said slice, each r.f. pulse being at the Larmor frequency for said nuclei in said slice in the presence of the associated field gradient, and each r.f. pulse being effective to rotate said spins by not greater than 90°, said pulses together being sufficient to rotate the spins through said appreciably greater than 90° angle, and the gradients of said magnetic fields being in opposite directions.

2. A method according to claim 1 in which a first further magnetic field having a gradient is applied.

3. A method according to claim 2 in which said first further magnetic field is applied after said second r.f. pulse and a second further magnetic field having a gradient is applied before the first of said two r.f. pulses, said second further gradient being in the opposite direction to said first further gradient.

4. A method according to claim 1 in which said angle is 180°.

5. A method according to claim 1 in which said two r.f. pulses are subtantially identical.

6. An appartus arranged to obtain a representation of the spatial distribution of a quantity relating to nuclear magnetic resonance in a selected slice of a larger body, wherein rotation of the spins of a chosen nucleus within the selected slice, about an axis perpendicular to the equilibrium axis of magnetic alignment of the spins is effected through an angle appreciably greater than 90°, the apparatus including: apparatus and circuitry arranged to apply in sequence two r.f. pulses, each said pulse accompanied by a magnetic field oriented in a direction parallel to said equilibrium axis and having a gradient in a direction orthogonal to the plane of said slice, each pulse being at the Larmor frequency for said nuclei in said slice in the presence of the associated field gradient, and each r.f. pulse being effective to rotate said spins by not greater than 90°, the r.f. pulses together being sufficient to rotate said spins through said appreciably greater than 90° angle, and the gradients of said magnetic fields being in opposite directions.

7. An apparatus according to claim 6 including means arranged to apply a first further magnetic field having a gradient.

8. An apparatus according to claim 7 including means arranged to apply said first further magnetic field after said second r.f. pulse and a second further magnetic field having a gradient before the first of said two r.f. pulses, said second further gradient being in the opposite direction to said first further gradient.

9. An apparatus according to claim 6 in which said two field pulses are subtantially identical.

* * * * *

UNITED STATES PATENT AND TRADEMARK OFFICE
CERTIFICATE OF CORRECTION

PATENT NO. : 4,564,813

DATED : January 14, 1986

INVENTOR(S) : Ian R. Young and David R. Bailes

It is certified that error appears in the above-identified patent and that said Letters Patent is hereby corrected as shown below:

Column 2, line 6, after "field" delete --having a gradient--;

Column 6, line 5, "appartus" should be --apparatus--.

Signed and Sealed this

Twentieth Day of May 1986

[SEAL]

Attest:

Attesting Officer

DONALD J. QUIGG

Commissioner of Patents and Trademarks